(12) United States Patent
King, Jr. et al.

(10) Patent No.: US 7,145,776 B2
(45) Date of Patent: Dec. 5, 2006

(54) MIDPLANE-LESS DATA STORAGE ENCLOSURE

(75) Inventors: Joseph P. King, Jr., Sterling, MA (US); Albert F. Beinor, Jr., Sutton, MA (US); John V. Burroughs, Mason, NH (US); Adrianna D. Bailey, Upton, MA (US); Stephen E. Strickland, Marlboro, MA (US); Maida Boudreau, Brimfield, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/745,100

(22) Filed: Dec. 22, 2003

(65) Prior Publication Data

US 2005/0135069 A1    Jun. 23, 2005

(51) Int. Cl.
*H05K 5/00* (2006.01)
(52) U.S. Cl. .................................. 361/725; 361/685
(58) Field of Classification Search ........ 361/683–687, 361/695, 720, 724–733; 312/223.1, 223.2; 362/133, 551, 555, 559; 439/928.4
See application file for complete search history.

(56) References Cited

U.S. PATENT DOCUMENTS

| | | | | |
|---|---|---|---|---|
| 5,193,050 | A * | 3/1993 | Dimmick et al. | 361/694 |
| 5,603,056 | A | 2/1997 | Totani | |
| 5,673,132 | A | 9/1997 | Carbone, Jr. et al. | |
| 5,738,226 | A * | 4/1998 | Dean | 211/41.17 |
| 5,852,543 | A * | 12/1998 | Kannler | 361/608 |
| 5,890,214 | A | 3/1999 | Espy et al. | |
| 5,901,151 | A | 5/1999 | Bleiwiess et al. | |
| 5,912,799 | A * | 6/1999 | Grouell et al. | 361/685 |
| 6,166,917 | A * | 12/2000 | Anderson | 361/756 |
| 6,317,800 | B1 | 11/2001 | Westby et al. | |
| 6,421,711 | B1 | 7/2002 | Blumenau et al. | |
| 6,425,049 | B1 | 7/2002 | Yamamoto et al. | |
| 6,430,714 | B1 | 8/2002 | McAdam et al. | |
| 6,473,301 | B1 | 10/2002 | Levy et al. | |
| 6,483,709 | B1 * | 11/2002 | Layton | 361/724 |
| 2002/0044562 | A1 | 4/2002 | Killen, Jr. et al. | |
| 2002/0199048 | A1 * | 12/2002 | Rabinovitz | 710/100 |
| 2004/0031767 | A1 * | 2/2004 | Ice | 211/26 |
| 2004/0214476 | A1 * | 10/2004 | Haas et al. | 439/701 |
| 2005/0219809 | A1 * | 10/2005 | Muncaster et al. | 361/685 |

* cited by examiner

*Primary Examiner*—Lynn Feild
*Assistant Examiner*—Anthony Q. Edwards
(74) *Attorney, Agent, or Firm*—Guerin & Rodriguez, LLP; Michael A. Rodriguez (57) ABSTRACT

Described is a midplane-less data storage enclosure having a control board module with an electrical connector and a bulkhead assembly with a plurality of spaced-apart disk-drive guides coupled to a bulkhead. The disk-drive guides and bulkhead together define a plurality of disk-drive slots. The bulkhead has connected thereto a plurality of first electrical connectors and a second electrical connector in electrical communication with each of the first electrical connectors. Each slot slidably receives a storage disk drive such that the storage disk drive electrically connects to one of the first electrical connectors. The second electrical connector is electrically connected to the connector of the control board module so that each storage disk drive connected to one of the first electrical connectors is in electrical communication with the control board module.

19 Claims, 11 Drawing Sheets

FIG. 10

MIDPLANE-LESS DATA STORAGE ENCLOSURE

FIELD OF THE INVENTION

The invention relates generally to data storage systems. More particularly, the invention relates to midplane-less implementations of data storage enclosures.

BACKGROUND

A common feature present in typical implementations of data storage system enclosures is the midplane. Generally, a midplane is a multi-layer printed circuit board that provides interconnection among the various modules in the storage enclosure, such as storage disk drives and control boards. Inserted through front slots of the enclosure, storage disk drives connect to one side of the midplane; control boards connect to the other side of the midplane from the back. Over signal paths constructed into the midplane the control boards communicate with the storage disk drives.

Enclosures employing a midplane have certain disadvantages that can impede the development of low-cost data storage systems. Apart from manufacturing costs associated with a midplane, the electronics of the midplane also has associated reliability and repair concerns. Typically, the midplane is "tuned" to perform optimally with the control boards and disk drive modules in the storage enclosures. Problems with a midplane can require its replacement. However, whereas the task of installing a new storage disk drive through a front slot or of replacing a control board through the rear side of the enclosure are relatively easy to perform, replacing or retuning a midplane often requires the burdensome task of disassembling the enclosure itself. Moreover, a midplane can occupy a sizable area within a data storage enclosure, thus placing a limit on the minimum size of a data storage enclosure design. Thus, there remains a need for a midplane-less data storage enclosure that avoids the disadvantages of having a midplane.

SUMMARY

In one aspect, the invention features a midplane-less storage enclosure, comprising a control board module having an electrical connector and a bulkhead assembly having a plurality of spaced-apart disk-drive guides coupled to a bulkhead to define a plurality of disk-drive slots. The bulkhead has connected thereto a plurality of first electrical connectors and a second electrical connector in electrical communication with each of the first electrical connectors. Each slot slidably receives a storage disk drive such that the storage disk drive electrically connects to one of the first electrical connectors. The second electrical connector is electrically connected to the connector of the control board module so that each storage disk drive connected to one of the first electrical connectors is in electrical communication with the control board module.

In another aspect, the invention features a bulkhead assembly for connecting storage disk drives to a control board module. The bulkhead assembly comprises a bulkhead having a front wall, a base surface extending generally perpendicularly from the front wall, and a rear wall extending generally perpendicularly from the base surface and opposite the front wall. A plurality of electrical connectors is connected to the front wall, and a plurality of spaced-apart disk-drive guides are coupled generally perpendicular to the front wall of the bulkhead. Each disk-drive guide has a surface with a groove formed therein for receiving a side edge of a storage disk drive. The grooves of the opposing surfaces of an adjacent pair of spaced-apart disk-drive guides define a slot into which the storage disk drive can be slidably inserted. The slot is aligned with the one of the electrical connectors so that an electrical connector of the storage disk drive makes an electrical connection with the one of the electrical connectors when the storage disk drive is inserted into the slot.

In yet another aspect, the invention features a disk-drive guide comprising a planar portion having a beveled top edge with a resilient tab projecting therefrom, a first surface, and a second surface on an opposite side of the planar portion than the first surface. Each surface has a plurality of grooves formed therein. Each groove is sized to receive an edge of a storage disk drive. The top edge of the planar portion is closely received into an edge-guide located on a surface of a chassis of an enclosure while the resilient tab projects into an opening in the chassis surface when the disk-drive guide is installed in the chassis.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Data storage enclosures constructed in accordance with the invention operate without a midplane. In brief overview, the invention features an electromechanical mechanism for connecting storage disk drives directly to a control board, thus enabling such storage components to exchange signals and data without having to traverse signal traces of a midplane. The ability to operate without a midplane enables designs for smaller data storage enclosures, reduces manufacturing costs, and avoids the aforementioned reliability and repair concerns associated with a midplane.

Figure 1:
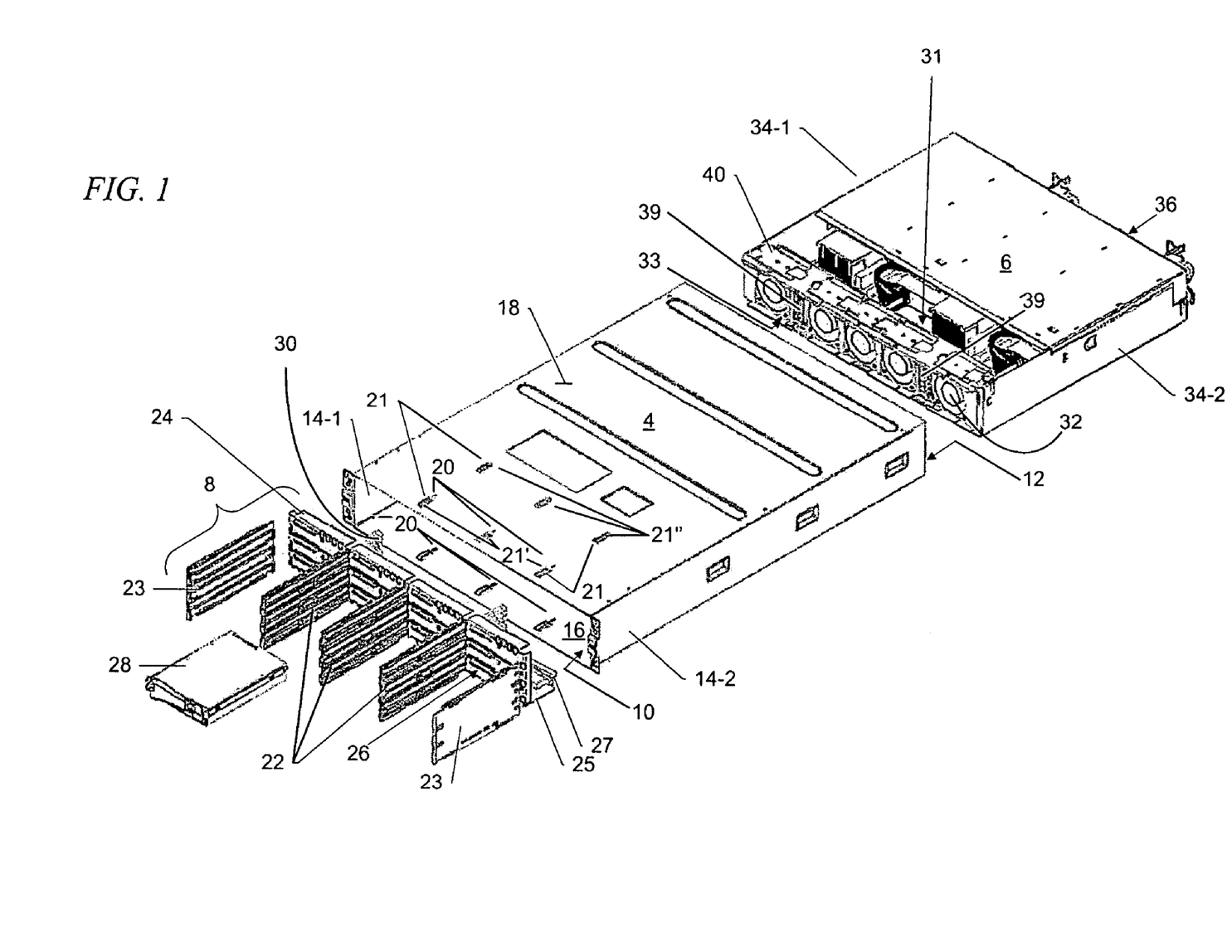
FIG. 1 is an exploded view of an embodiment of a data storage enclosure constructed in accordance with the invention.

FIG. 1 shows an exploded view of a midplane-less data storage enclosure 2 constructed in accordance with the invention. Fully assembled, one embodiment of the data storage enclosure 2 has a front-to-back dimension of approximately 26 inches and a width of approximately 17¾ inches. The data storage enclosure 2 includes a chassis 4 for housing a control board module 6 connected to a bulkhead assembly 8. The chassis 4 has an open front end 10, and open back end 12, a pair of side walls 14-1, 14-2, a bottom surface 16, and a top surface 18. In one embodiment, the chassis 4 is constructed of electrically conductive material such as sheet metal.

Near the front end 10 of the chassis 4, the bottom and top surfaces 16, 18 each have a plurality of openings 20 and edge-guides 21. For clarity, only a portion of the openings 20 and edge-guides 21 have reference numerals drawn to them in the figure. The edge-guides 21 are aligned in pairs comprised of a forward edge-guide 21' and a rearward edge-guide 21". On each surface 16, 18, each opening 20 is aligned between each pair of edge-guides 21', 21". For purposes of this description, the use of terms such as top, bottom, side, front, back, forward, rearward, vertical, and lateral, is with respect to the horizontal orientation of the data storage enclosure 2 as shown in FIG. 1. It is to be understood that such terms are relative to the particular orientation of the enclosure 2, and are not intended to place a restriction upon the orientation of the enclosure 2 when deployed in its field of operation.

The bulkhead assembly 8 includes a plurality of spatially separated inner disk-drive guides 22, outer disk-drive guides 23, and a G-shaped bulkhead 24. One end of each inner disk-drive guide 22 is attached to the bulkhead 24, and the edges of the outer disk-drive guides 23 are attached to the chassis 4. The planes of disk-drive guides 22, 23 are generally parallel to each other and extend generally perpendicularly away from a front wall 26 of the bulkhead 24. Opposing surfaces of each pair of adjacent disk-drive guides 22, 23 define storage disk-drive slots. Each storage disk-drive slot closely receives a storage disk drive 28. In the embodiment shown, the bulkhead assembly 8 includes five storage disk-drive guides 22, 23 that divide the bulkhead 24 into four sections or columns, each section defining slots for three storage disk-drives for 12 storage disk drives in all. In one embodiment, the storage disk drives 28 are Serial Advanced Technology Attachment (SATA) drives, and the lateral spacing between adjacent disk-drive guides 22, 23 is such that each storage disk-drive slot closely receives an ATA drive. Other types of storage disk-drives, such as parallel ATA (PATA) and Fibre Channel, can be used without departing from the principles of the invention.

Extending perpendicularly from a rear face of the bulkhead 24 is a plurality of light-pipes 30. Edge connectors 25, of which only one is seen in FIG. 1, extend from a rear wall of the G-shaped bulkhead 24.

In general, the control board module 6 includes redundant storage processors (not shown) and attendant circuitry, for writing data to and reading data from the storage disk drives 28 inserted into slots of the bulkhead assembly 8, and redundant power supplies for powering the storage processors and disk drives 28. The control board module 6 includes a processor board 31 to which the power supplies and storage processors are electrically connected, a plurality of electrical finger connectors 32 extending from an edge 33 of the processor board 31, side walls 34-1, 34-2, a rear wall 36, and a top portion 38. A fan assembly 40 extends between the side walls 34-1, 34-2 at the edge 33 of the processor board 31. The lateral and vertical dimensions of the control board module 6 are such that the control board module 6 fits closely within the chassis 4.

To assemble the enclosure 2, the bulkhead assembly 8 slides into the open front end 10 of the chassis 4 and the control board module 6 slides into the chassis 4 through the open back end 12. (The three inner disk-drive guides 22 are typically attached before the bulkhead assembly 8 is inserted into the chassis 4, and the two outer disk-drive guides 23 are attached after the bulkhead assembly 8 is inserted into the chassis 4.) The edge connectors 32 attach to the edge connectors 25 of the bulkhead 24, to secure the control board module 6 to the bulkhead assembly 8. The light pipes 30 extending from the bulkhead 24 align with the LED modules 39. Within the chassis 4, the generally G-shape of the bulkhead 24 provides a plenum in front of the fan assembly 40. In one embodiment, the distance from the front wall 26 of the bulkhead 24 to the front of the fan assembly 40 is approximately 1.5 inches. During operation, the fans draw air from the front end 10 of the chassis 4 to the back end 12. The air passes over and below the storage disk drives 28 through openings in the wall 26 of the bulkhead 24, through the plenum, and into the control board module 6.

Figure 2:
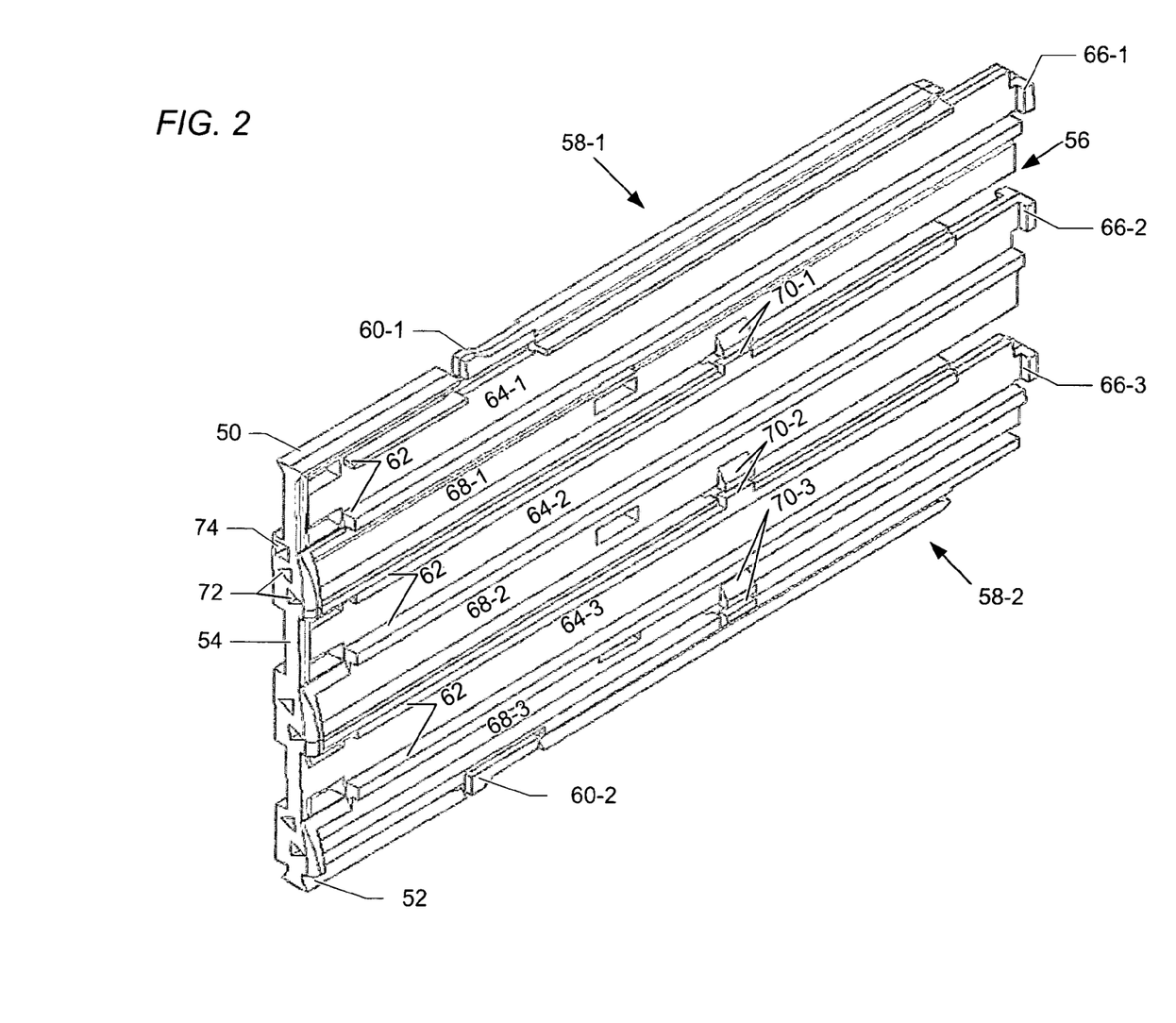
FIG. 2 is an isometric view of an embodiment of a disk-drive guide of the invention.

FIG. 2 shows an isometric side view of an embodiment of a disk-drive guide 22 including a beveled top edge 50, a beveled bottom edge 52, a front face 54, a back end 56, and opposite sides 58-1, 58-2. Each outer disk-drive guide 23 has features similar to those described below for the disk-drive guide 22, with particular differences being noted. In one embodiment, each disk-drive guide 22, 23 is made of plastic material. Each beveled edge 50, 52 has a resilient tab 60-1, 60-2, respectively. The locations of the tabs 60-1, 60-2 on their respective edges 50, 52 correspond to the locations of the openings 20 in the top and bottom surfaces 18, 16 of the chassis 4. Each side 58-1, 58-2 has a plurality of pairs of raised ridges 62 extending for part of the length of the disk-drive guide 22, 23 (one of the sides 58-1, 58-2 of each outer disk-drive guide 23 can be planar, i.e., the outer side can be without groove-defining ridges). Each pair of raised ridges 62 defines a groove 64 for slidably receiving a lip or an edge of a storage disk drive 28. In the embodiment shown, the raised ridges 62 define three grooves 64-1, 64-2, 64-3 for three storage disk drives 28. Each storage disk drive 28 enters one of the grooves 64 from the front face 54 of the disk-drive guide 22, 23.

Extending from the back end 56 from each inner disk-drive guide 22, at the end of each groove 64-1, 64-2, 64-3, is a T-shaped tab 66-1, 66-2, 66-3, respectively (generally T-shaped tab 66). As described in more detail below, each T-shaped tab 66 enters an opening in the front wall 26 of the bulkhead 24 and slides into a locking position within the opening to secure the disk-drive guide 22 to the bulkhead 24. In one embodiment, the outer disk-drive guides 23 abut but do not attach to the bulkhead 24 when installed in the chassis 4, and accordingly do not have tabs corresponding to the tabs 66 of the disk-drive guides 22. In another embodiment, the outer disk-drive guides 23 have tabs that project through and secure to the bulkhead 24.

Each side 58-1, 58-2 also has a plurality of channels 68-1, 68-2, 68-3 (generally, channel 68) extending lengthwise through that side from the front face 54 to the back end 56. Each channel 68 receives a light-pipe (not shown). Tab pair 70 constrains the light-pipe 30 within the channel 68. Each light-pipe 30 enters the inner disk-drive guide 22 from the back end 56 and abuts an arrow-shaped window 72 or to a rectangular window 74 in the front face 54. Each window 72, 74 is a transparent region of the front face 54. Light emanating from an arrow-shaped window 72 serves to indicate the operational status of the storage disk drive 28 towards which that arrowed window 72 is generally pointing. The rectangular window 74 indicates an operational status (e.g., system fault or system operational) of the data storage enclosure 2. The light originates from LEDs on the control board module 6 and travels through the light-pipes 30 embedded in the channels 68 of the disk-drive guide 22. Although formed with light-pipe channels 68, whether a particular disk-drive guide 22 has any installed light-pipes 30 depends upon the location of that disk-drive guide 22 in the bulkhead assembly 8. For example, in the embodiment shown, the inner disk-drive guide 22 at the center of the bulkhead assembly 8 does not have light-pipes 30. Similarly the outer disk-drive guides 23 do not carry light-pipes (and may be constructed without channels 68). Accordingly, the front faces 54 of these particular disk-drive guides 22, 23 can be constructed without windows 72, 74.

Figure 3A:
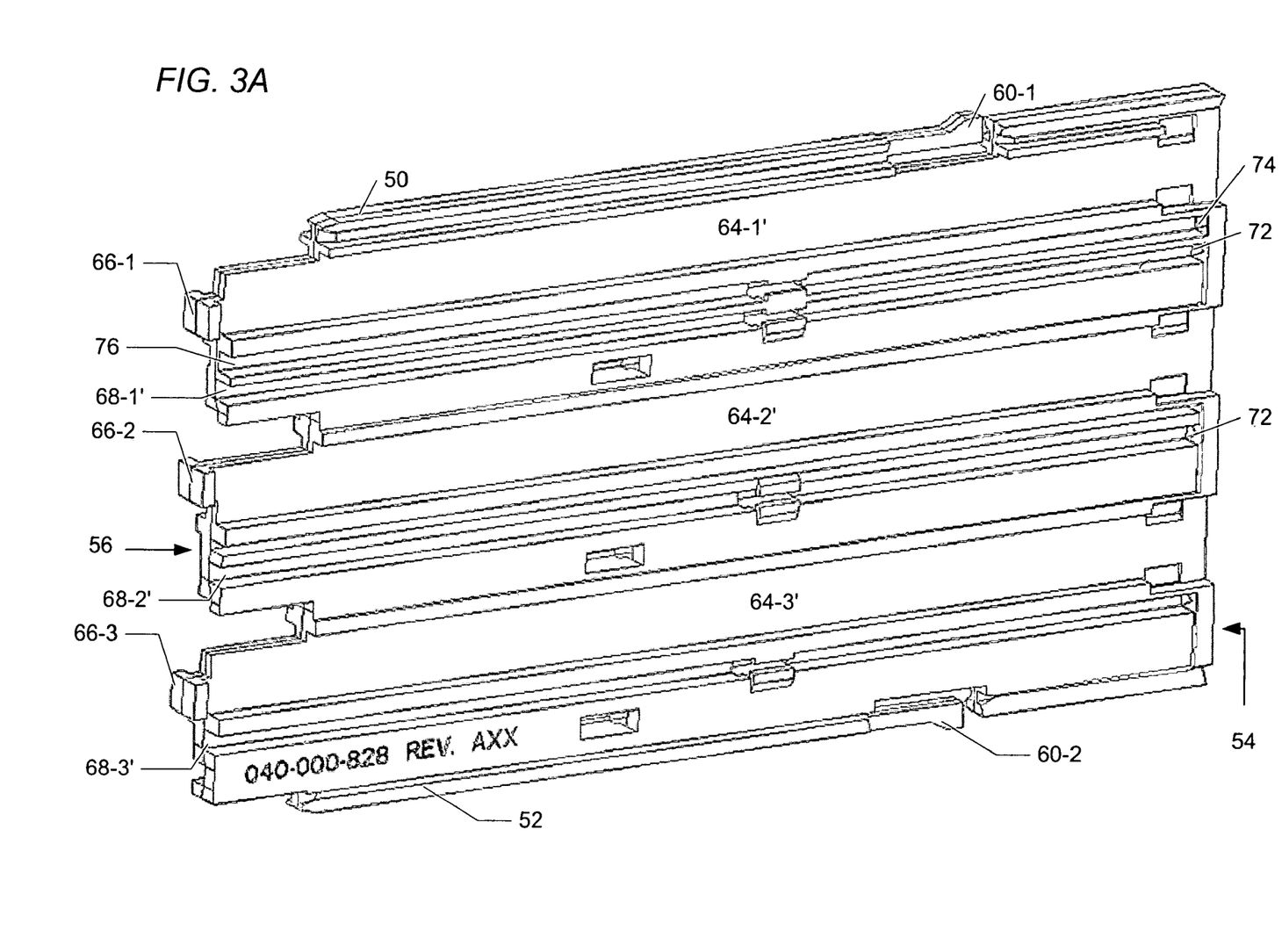
FIG. 3A is a side view of a first side of the embodiment of the disk-drive guide of FIG. 2.
Figure 3B:
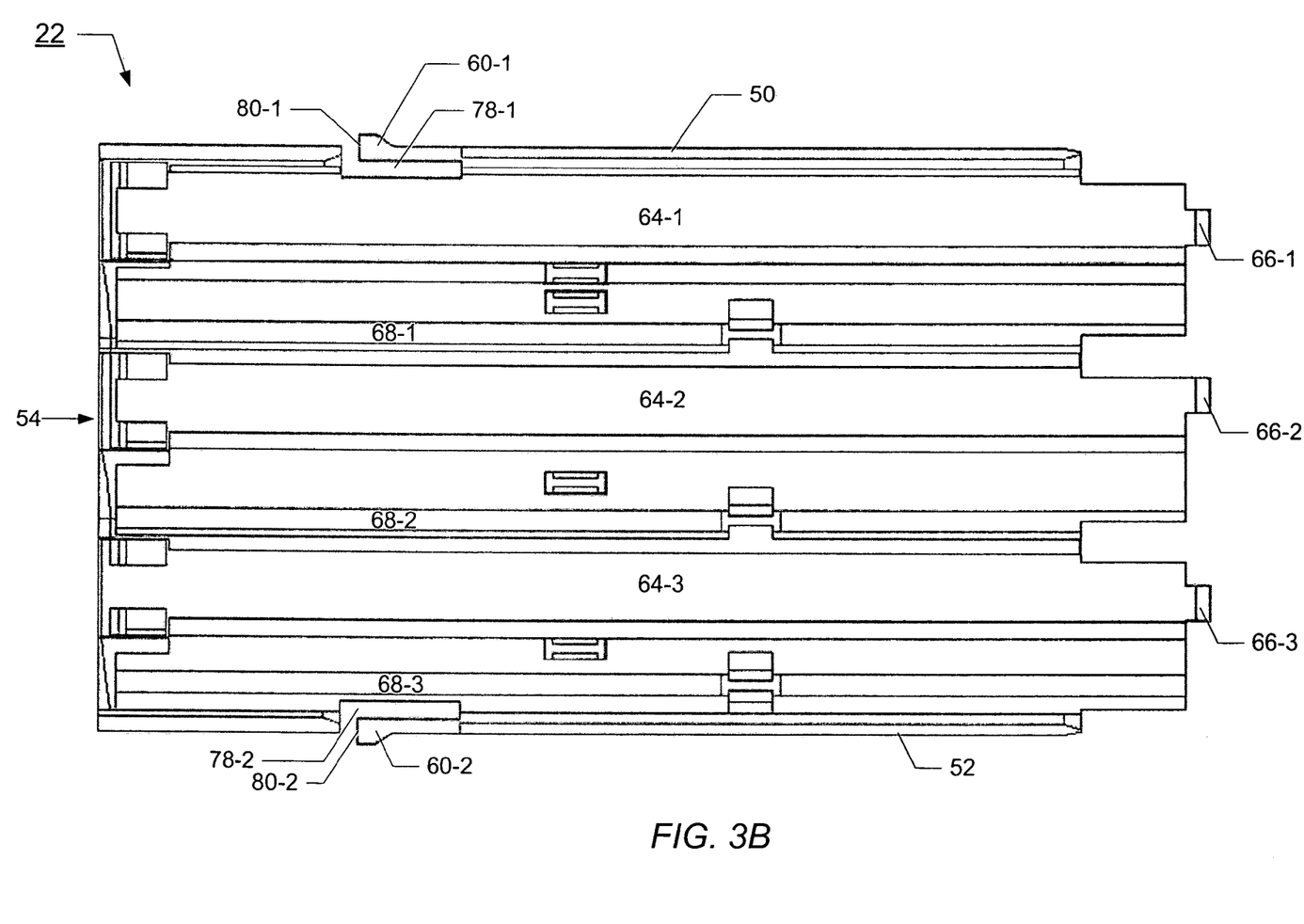
FIG. 3B is a side view of the opposite side of the embodiment of the disk-drive guide of FIG. 2.

FIG. 3A and FIG. 3B show the inner disk-drive guide 22 from the one side 58-1 and the opposite side 58-2, respectively. FIG. 3A shows grooves 64-1', 64-2', and 64-3' (generally, groove 64'), each for receiving an edge of a storage disk drive 28. Each groove 64' is located opposite a corresponding groove 64 on the other side 58-2 of the disk-drive guide 22. The side 58-1 also has a plurality of light-pipe channels 68-1', 68-2', and 68-3' extending the length of the disk-drive guide 22, from the back end 56 to the front face 54, and ending at an arrowed window 72. An additional light-pipe channel 76 in the side 58-1 extends to the rectangular window 74.

The view provided in FIG. 3B of the other side 58-2 illustrates the projection of the resilient tab 60-1 above the top edge 50 and of the resilient tab 60-2 below the bottom edge 52. Behind each resilient tab 60 is an open region 78-1, 78-2 into which the respective tab 60-1, 60-2 bends upon coming into contact with the top 18 or bottom 16 chassis surface when the bulkhead assembly 8 is slid into the chassis 4. The tabs 60 return to their original shape when the tabs 60 become aligned with the openings 20 in the top 18 and bottom 16 surfaces. By returning to their original shapes, the tabs 60 project into the openings 20. The planar edge 80-1, 80-2 of each tab 60-1, 60-2, respectively, prevents the bulkhead assembly 8 from sliding back out of the chassis 4. Corresponding tabs 60 of the outer disk-drive guides 23 also enter respective openings 20 in the top 18 and bottom 16 surfaces of the chassis 4 to prevent such disk-drive guides 23 from sliding back out of the chassis 4.

Figure 4:
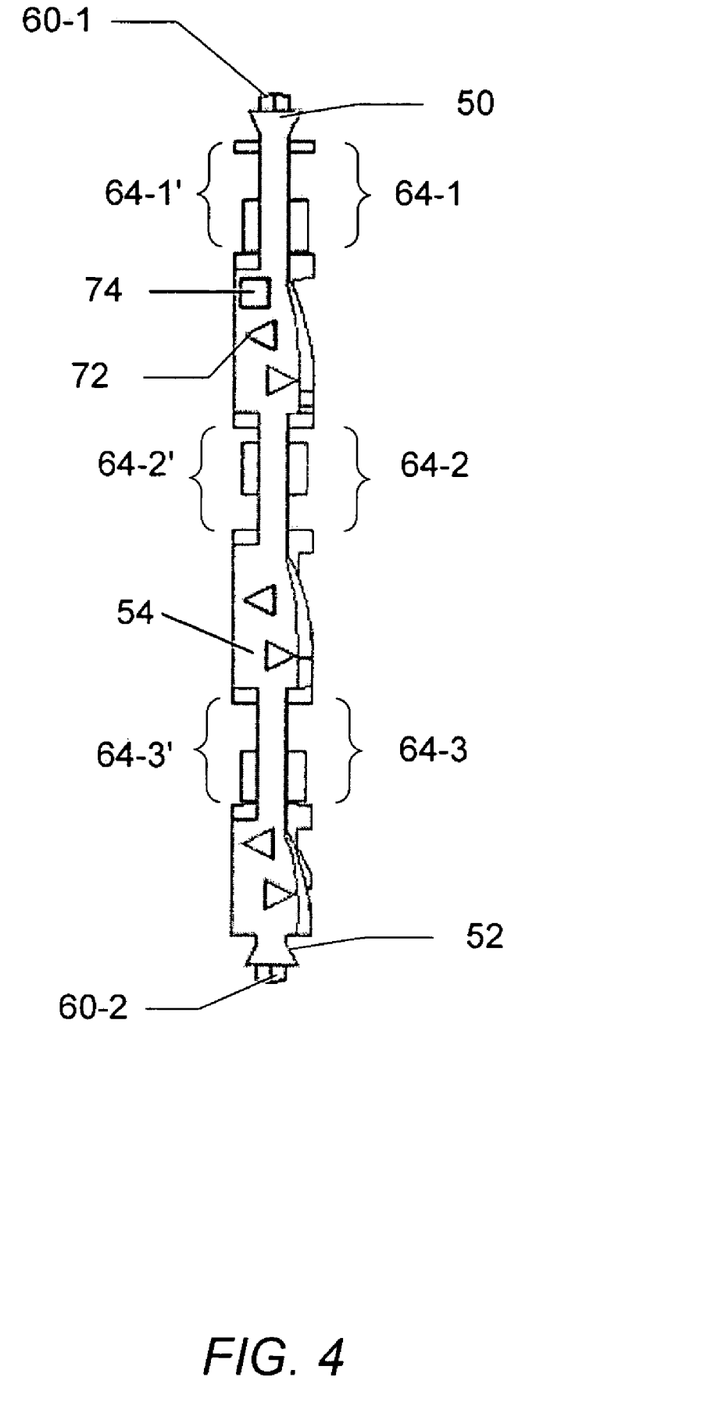
FIG. 4 is a front view of the embodiment of the disk-drive guide of FIG. 2.

FIG. 4 shows a front view of the embodiment of the inner disk-drive guide 22 of FIG. 2. Directed at the front face 54, this front view shows the beveled aspect of the top and bottom edges 50, 52 of the disk-drive guide 22. When the disk-drive guide 22, as part of the bulkhead assembly 8, is slid into the chassis 4, the beveled top edge 50 slides into the forward and rearward edge-guides 21', 21" located on the underside of the top chassis surface 18 and the beveled bottom edge 52 slides into the forward and rearward edge-guides 21', 21" on the topside of the bottom chassis surface 16. The forward and rearward edge-guides 21', 21" restrain the front and back of the disk-drive guide 22, respectively, from moving laterally within the chassis 4. Thus, the tabs 60 and beveled edges 50, 52, in combination with the openings 20 and edge-guides 21, secure the bulkhead assembly 8 to the chassis 4, without the need for mechanical fasteners such as screws and bolts.

Figure 5:
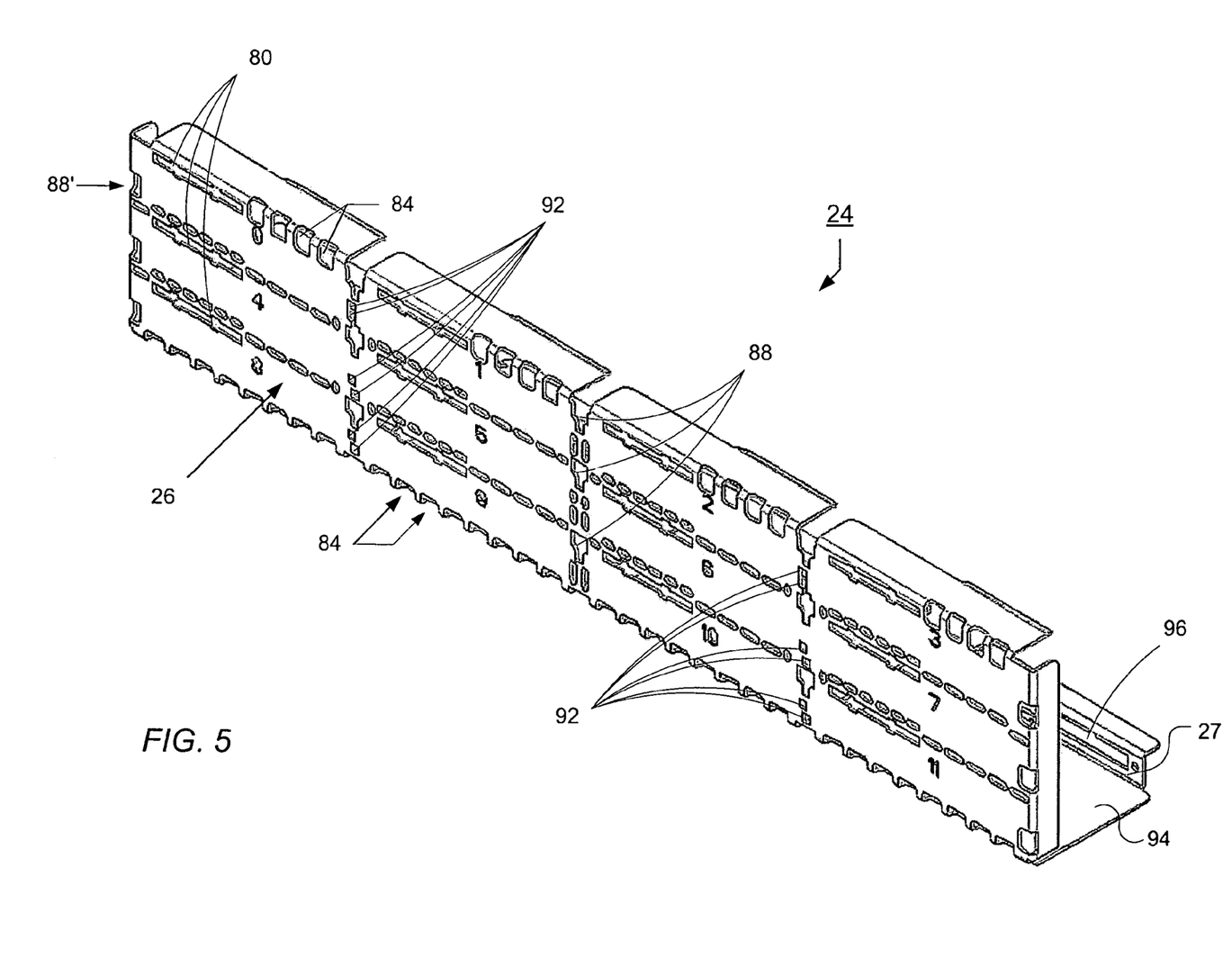
FIG. 5 is an isometric front view of an embodiment of a bulkhead of the invention.

FIG. 5 shows an embodiment of the G-shaped bulkhead 24 with the perforated front wall 26, a base surface 27 extending generally perpendicularly from the front wall 26, and a rear wall 94 extending generally perpendicularly from the base surface 27 and opposite the front wall 26. The bulkhead 24 can be constructed of various materials, such as sheet metal or injection molded plastic. Openings 80 are each for receiving an electrical connector that connects to a storage disk drive 28 to be installed in the enclosure 2. This particular embodiment has twelve such openings 80 for twelve storage disk drives 28 (four columns of three), although not all twelve are numbered for the sake of clarity. In one embodiment, the wall 26 of the bulkhead is numbered from 0 to 11 to identify the individual storage disk drive locations. Openings 84 are provided to permit the front-to-back flow of air drawn by the fans in the control board module 6. Only a portion of the openings 84 are numbered.

T-shaped openings 88 are for receiving the T-shaped tabs 66 of the disk-drive guides 22. The dimensions of each T-shaped opening 88 are such that the tab 66 can be inserted completely through the wide portion of the opening 88, and then slid downward into the narrow portion of the opening 88. When that tab 66 is in this locked position, the disk-drive guide 22 cannot slide forward or backward with respect to the bulkhead 24.

Figure 6:
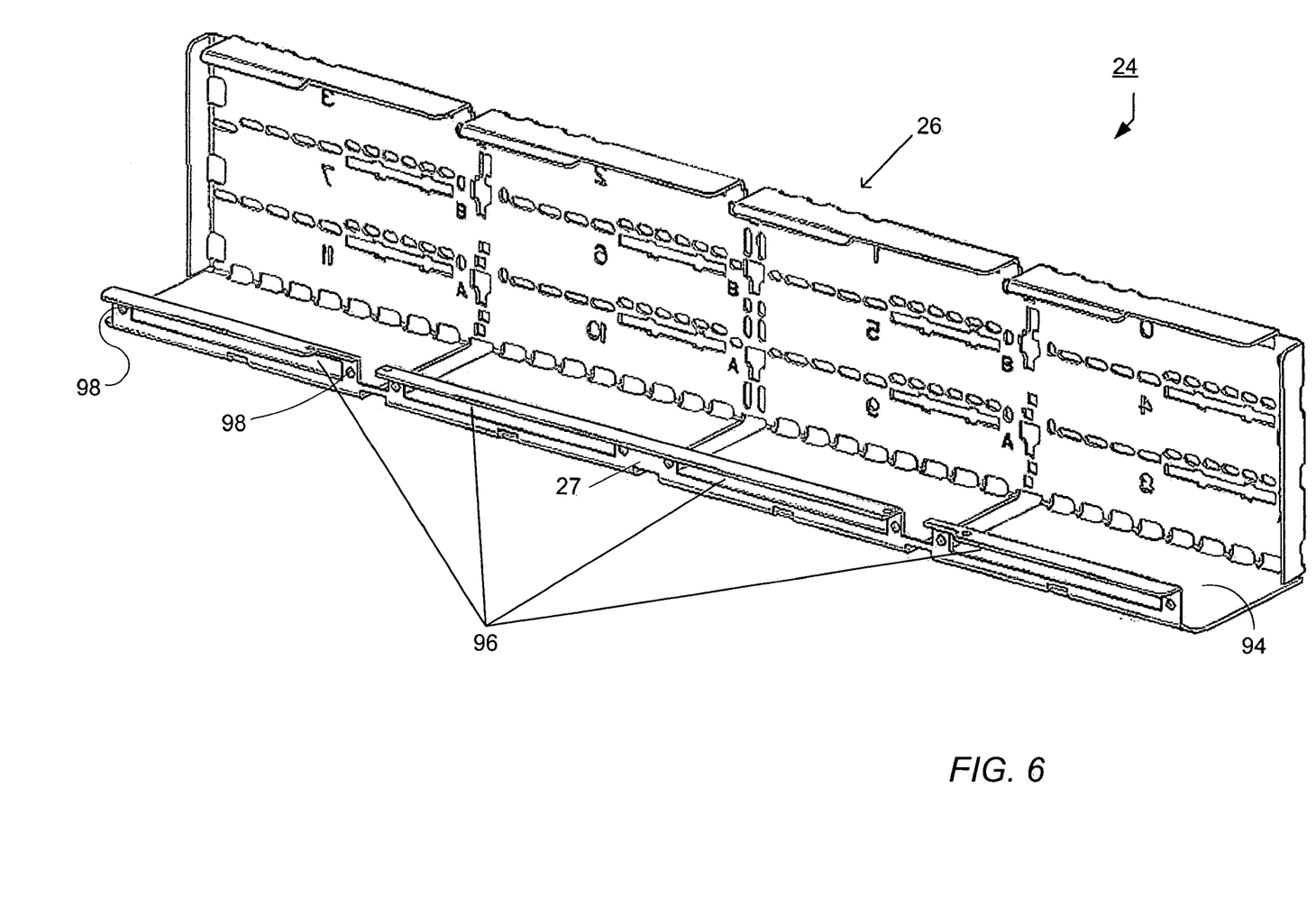
FIG. 6 is a rear view of the embodiment of the bulkhead of the invention.

Openings 92 are for receiving the light-pipes 30 (FIG. 1) that extend therethrough from the back side of the bulkhead 24 into the channels 68 of the disk-drive guides 22. In one embodiment, such light-pipe openings 92 are formed in the bulkhead 24 only for the two disk-drive guides 22 that are to be placed immediately adjacent the center disk-drive guide 22. The rear wall 94 of the bulkhead 24 has a plurality of openings 96 (only one of which is visible in FIG. 5), each opening 96 being sized to receive an edge connector (not shown). FIG. 6 shows a rear view of the bulkhead 24 to further illustrate the location of the plurality of connector openings 96 formed in the rear wall 94. In the embodiment shown, there are openings 96 for four connectors, one connector for each of the four columns of storage disk drives. Also formed in the rear wall 94 is a pair of openings 98 on opposite sides of each connector opening 96. Fasteners, such as screws, pass through these openings to secure the connectors to the rear wall 94.

Figure 7:
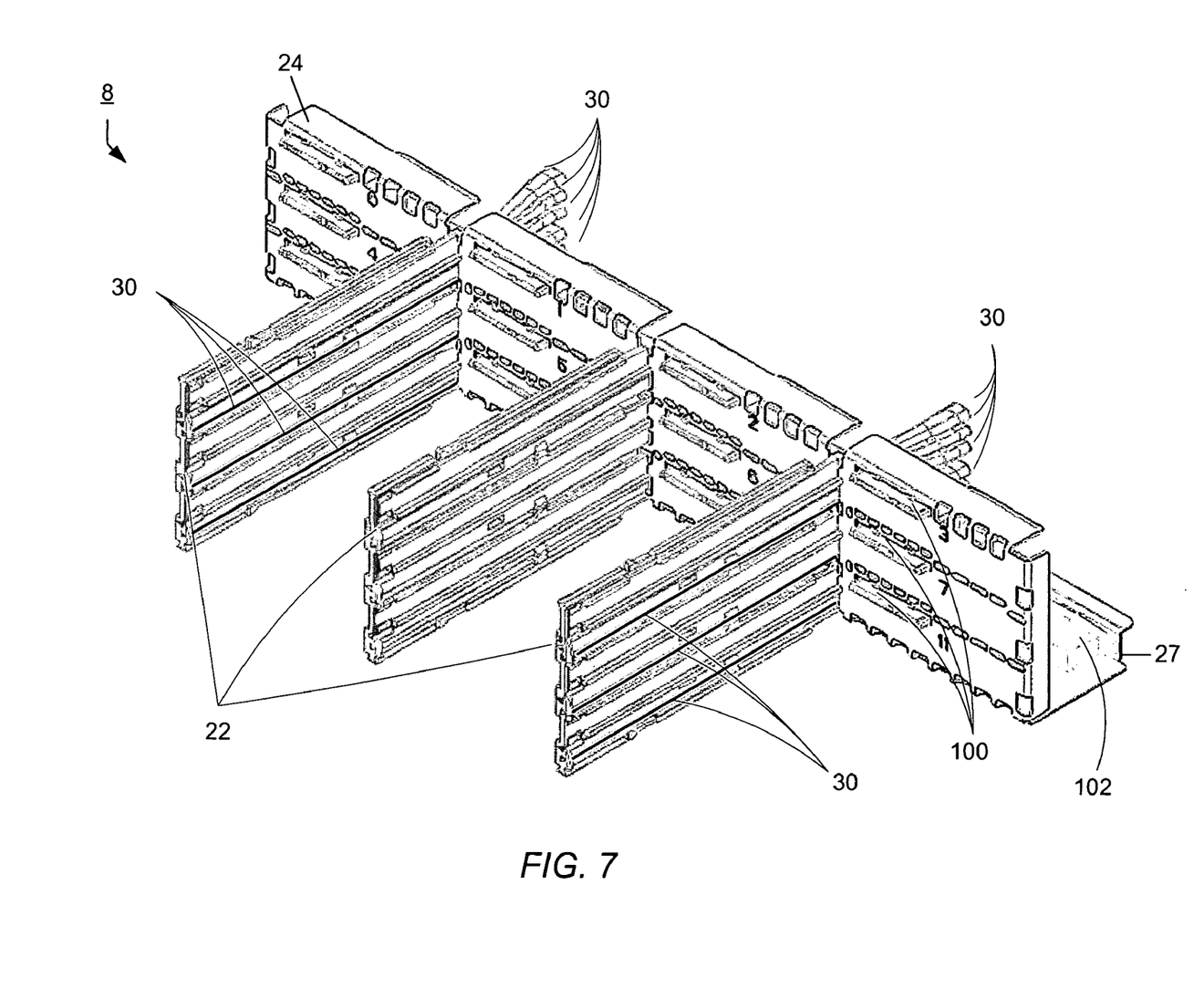
FIG. 7 is a front view of an embodiment of a bulkhead assembly including a plurality of storage rails attached to the bulkhead of FIG. 5.
Figure 8:
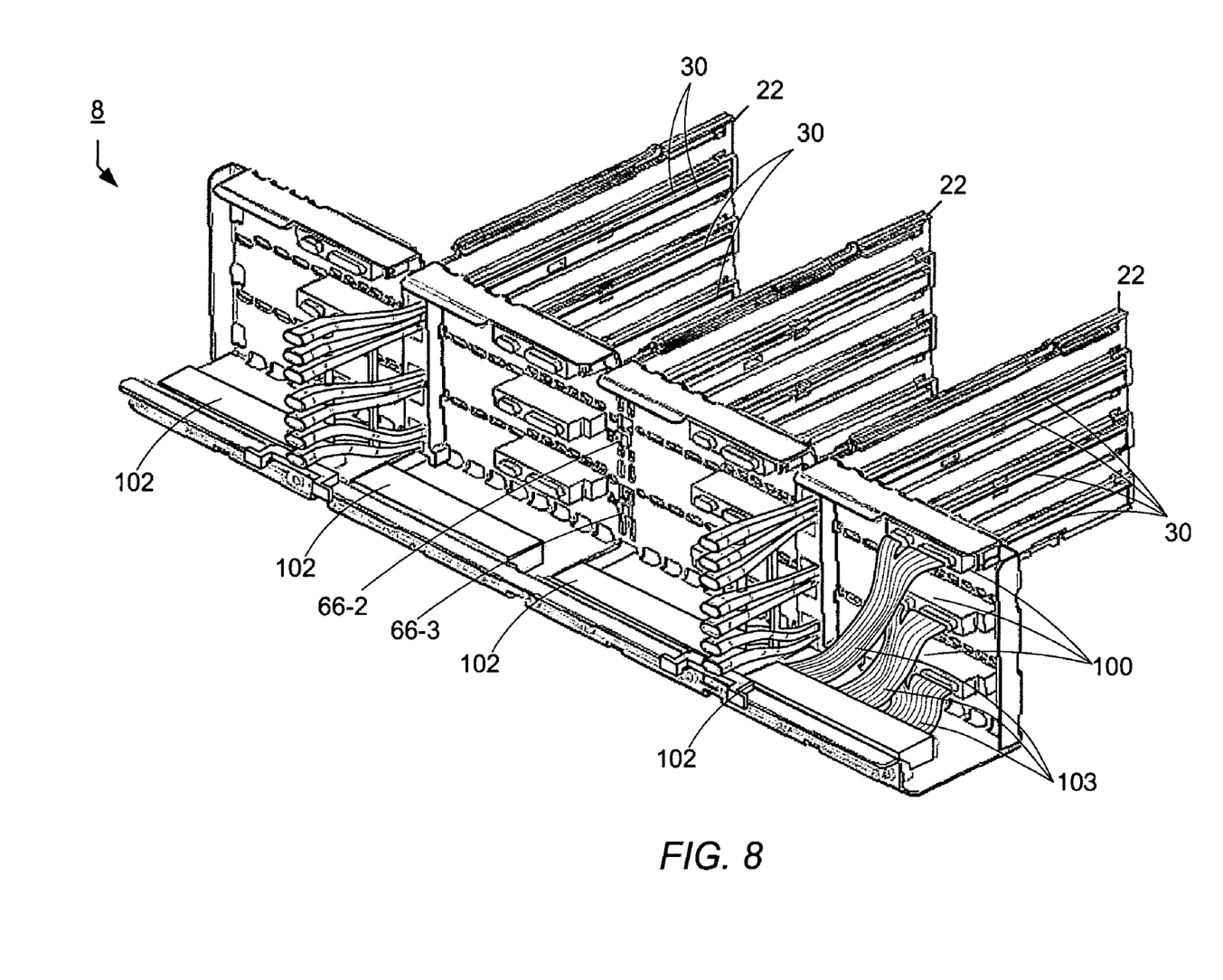
FIG. 8 is a rear view of the embodiment of the bulkhead assembly of FIG. 7, including a plurality of light pipes connected to the bulkhead.

FIG. 7 shows a front view of one embodiment of the bulkhead assembly 8 with three inner disk-drive guides 22 coupled to the front of the bulkhead 24. Light-pipes 30 extend through light-pipe channels in two of the three disk-drive guides 22 and project from the back of the bulkhead 24 to form two columns of seven light-pipes 30. Electrical connectors 100 are inserted into each of the connector openings 80 (FIG. 5), being pushed through the connector opening 80 from the rear side of the bulkhead 24, and secured to the bulkhead 24 by a fastener. In embodiments using Serial ATA disk drives, the electrical connectors 100 are standard Serial ATA connectors. Such connectors permit Serial ATA disk drives to be hot swapped, that is, inserted and removed while power is being supplied to the connector 100 for the disk drive. An edge connector 102 is also shown mounted to the rear wall 94 at one of the connector openings 96 (FIG. 6). FIG. 8 shows the bulkhead assembly 8 from a rear view to illustrate more clearly the two sets of seven light-pipes 30, the electrical connectors 100, and the edge connectors 102. There is one edge connector 102 for each column of electrical connectors 100. For each column, electrical ribbon cables or wires 103 electrically connect the three electrical connectors 100 to one edge connector 102 located at the base of that column. In the embodiment shown, four edge connectors 102 are shown, and each edge connector 102 makes an electrical connection to three SATA electrical connectors 100.

Figure 9:
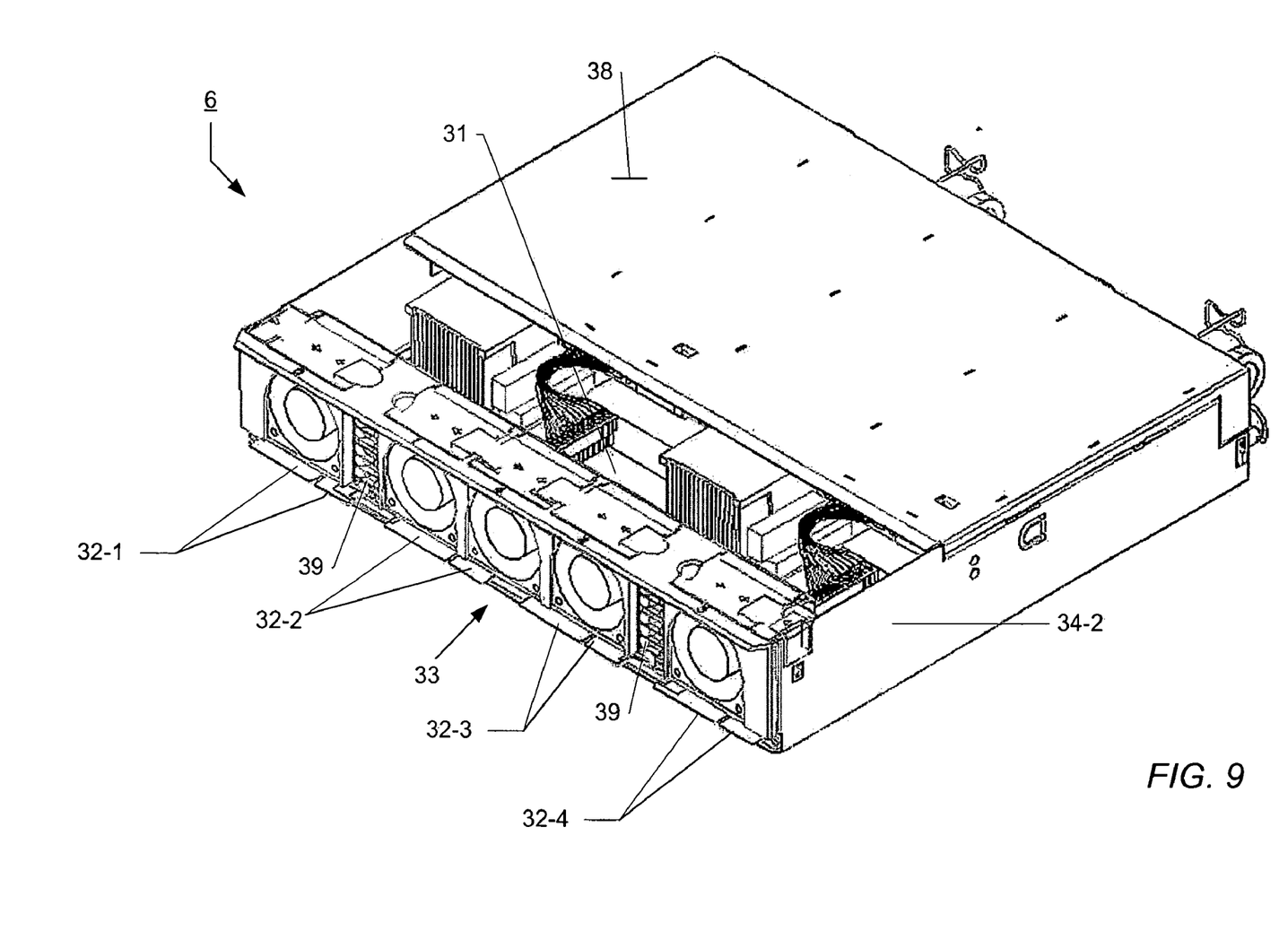
FIG. 9 is an isometric view of an embodiment of control board module including a fan assembly and LED modules.

FIG. 9 shows the control board module 6 of FIG. 1 in more detail, including the row of electrical finger connectors 32-1, 32-2, 32-3, 32-4 extending from the edge 33 of the processor board 31, the fan assembly 40 extending between the side walls 34-1, 34-2 at the edge 33 of the processor board, and the LED modules 39. Each edge connector 32 mates with a corresponding edge connector 102 mounted to the bulkhead assembly 8. Individual fans or the entire fan assembly 40 can be removed from the control board module 6.

Figure 10:
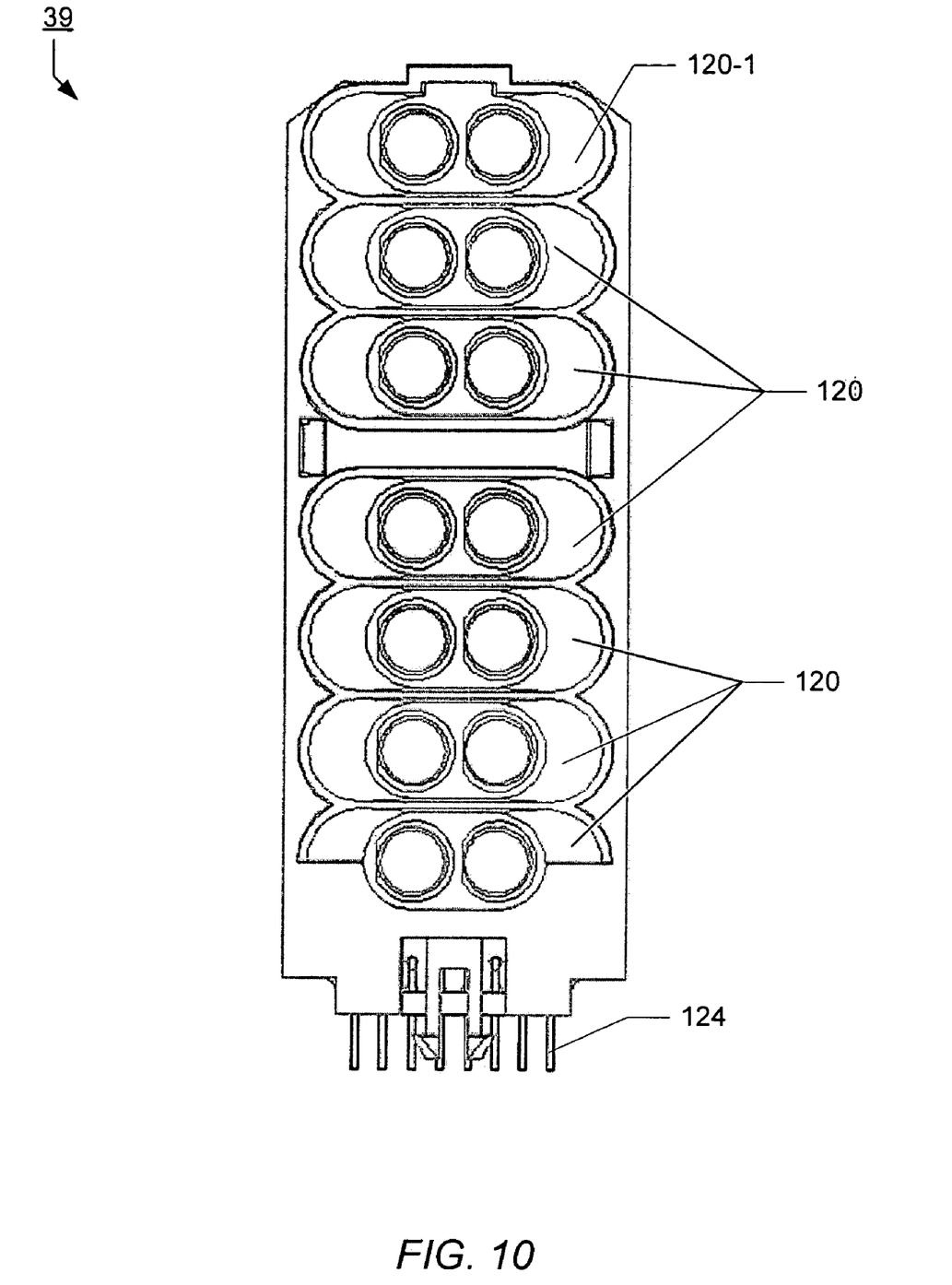
FIG. 10 is a front view of an embodiment of an LED module.

FIG. 10 shows a front view of an embodiment of an LED module 39. The LED module 39 includes a plurality of stacked pairs of LED pairs 120, a circuit board (not shown) connected to each LED, and a plurality of electrical pins 124 by which the LEDs are in electrical communication with the processor board 31 of the control board module 6. In this embodiment, the electrical pins 124 are arranged in two rows of eight pins, the back row being occluded in the figure by the front row.

The LED module 39 displaces the LEDs from the plane of the processor board 31 so that the LEDs can be appropriately aligned with the light-pipes 30. An oval open-faced casing surrounds each LED pair 120 for closely receiving one of the light-pipes 30 extending from the back side of the bulkhead assembly 8. The top LED pair 120-1 in the LED stack 39 corresponds to a system status and connects to the light-pipe 30 that abuts the system status window 74 on the front face of the storage disk drive guide 22. The remaining LED pairs in the LED stack 39 correspond to one of the storage disk drives 28. One LED of each pair 120 indicates a system or disk drive fault, e.g., an amber LED, and the other indicates that the system of disk drive is operating properly, e.g., a green or blue LED.

While the invention has been shown and described with reference to specific preferred embodiments, it should be understood by those skilled in the art that various changes in form and detail may be made therein without departing from the spirit and scope of the invention as defined by the following claims.

What is claimed is:

1. A bulkhead assembly for connecting storage disk drives to a control board module, the bulkhead assembly comprising:
    a bulkhead having a front wall, a base surface extending generally perpendicularly from the front wall, and a rear wall extending generally perpendicularly from the base surface and opposite the front wall;
    a plurality of spaced-apart disk-drive guides coupled generally perpendicular to the front wall of the bulkhead, each disk-drive guide having a surface with a groove formed therein for receiving a side edge of a storage disk drive, the grooves in opposing surfaces of an adjacent pair of spaced-apart disk-drive guides defining a slot into which the storage disk drive can be slidably inserted;
    a plurality of electrical connectors connected to the front wall, each electrical connector being aligned within a different disk-drive slot for connecting to a storage disk drive slidably received therein and for conveying data signals exchanged between that storage disk drive and the control board module; and
    an electrical connector connected to the rear wall of the bulkhead for making electrical connection to the control board module, the electrical connector connected to the rear wall being directly connected by electrical wiring to each of the electrical connectors connected to the front wall of the bulkhead, the control board module exchanging data signals with each of the storage disk drives in the disk-drive slots through the same electrical connector connected to the rear wall.

2. The bulkhead assembly of claim 1, further comprising a light-pipe partially embedded in a channel of one of the disk-drive guides and extending through the front wall of the bulkhead.

3. The bulkhead assembly of claim 1, further comprising a plurality of light-pipes each embedded in a channel of one of the disk-drive guides and extending through the front wall of the bulkhead.

4. The bulkhead assembly of claim 1, wherein each disk-drive guide has a tab extending from one end thereof and the bulkhead has a T-shaped opening for receiving the tab and securing the disk-drive guide to the bulkhead.

5. The bulkhead assembly of claim 1, wherein each storage disk drive is a serial Advanced Technology Attachment drive.

6. A disk-drive guide, comprising a planar portion having a beveled top edge with a resilient tab projecting therefrom, a first surface, and a second surface on an opposite side of the planar portion than the first surface, each surface having a plurality of grooves formed therein, each groove sized to receive an edge of a storage disk drive, the top edge of the planar portion being closely received into an edge-guide located on a surface of a chassis of an enclosure, the resilient tab bending when pressed against the chassis surface while the disk-drive guide slides within the edge-guide into the chassis and springing back to original shape within an opening in the chassis surface when the disk-drive guide is installed in the chassis.

7. The disk drive guide of claim 6, wherein the planar portion further comprises a beveled bottom edge with a resilient tab projecting therefrom, the bottom edge closely received into a second edge-guide located on a second surface of the chassis and the resilient tab of the bottom edge projecting into a second opening in the second chassis surface when the disk-drive guide is installed in the chassis.

8. The disk-drive guide of claim 6, wherein each of the first and second surfaces includes a plurality of channels for embedded light-pipes.

9. The disk-drive guide of claim 8, further comprising a front face having a plurality of transparent regions each aligned with one of the plurality of light-pipe channels.

10. The disk-drive guide of claim 6, further comprising a back end having a T-shaped tab extending therefrom for insertion into an opening in a wall of a bulkhead and, after being inserted, for sliding into a locked position to secure the disk-drive guide to the bulkhead wall.

11. The bulkhead assembly of claim 8, further comprising:
    a second plurality of electrical connectors connected to the front wall, each of the second plurality of electrical connectors connected to the front wall providing an electrical connection for a storage disk drive; and
    a second electrical connector connected to the rear wall of the bulkhead for making electrical connection to the control board module, the second electrical connector connected to the rear wall being directly connected by one or more electrical wires to each of the second plurality of electrical connectors connected to the front wall of the bulkhead.

12. A midplane-less storage enclosure, comprising:
    a control board module having an electrical connector; and a bulkhead assembly including:
- a bulkhead having a base and opposing first and second walls extending perpendicularly from the base;
- a plurality of spaced-apart disk-drive guides coupled to first wall of the bulkhead to define a plurality of disk-drive slots for slidably receiving storage disk drives;
- a plurality of first electrical connectors coupled to the first wall of the bulkhead, each first electrical connector being aligned within a different disk-drive slot for connecting to a storage disk drive slidably received therein and for conveying data signals exchanged between that storage disk drive and the control board module;
- an electrical connector coupled to the second wall of the bulkhead and connected to the electrical connector of the control board module; and
- wiring electrically connecting each of the first electrical connectors to the electrical connector coupled to the second wall, the control board module exchanging data signals with each of the storage disk drives in the disk-drive slots through the same electrical connector coupled to the second wall.

13. The midplane-less storage enclosure of claim 12, further comprising a chassis having a bottom, a top, and spaced-apart side walls, the bottom and top each having an edge-guide on an inner surface, and wherein each of the disk-drive guides has a beveled top edge and a beveled bottom edge for sliding into one of the edge-guides.

14. The midplane-less storage enclosure of claim 12, further comprising a chassis having a bottom, a top and spaced-apart side walls, the bottom and top each having an opening formed therein, and wherein each of the disk-drive guides has a resilient tab projecting from a top edge and a resilient tab projecting from a bottom edge for sliding into one of the openings to secure the disk-drive guide to the chassis.

15. The midplane-less enclosure of claim 12, further comprising a light-pipe embedded in a channel of one of the disk-drive guides, the light-pipe extending through the bulkhead.

16. The midplane-less storage enclosure of claim 15, further comprising a stack arrangement of light-emitting diodes (LEDs) electrically connected at an edge of the control board module, one of the LEDs being in optical communication with the light-pipe.

17. The midplane-less enclosure of claim 12, further comprising a plurality of fans mounted at an edge of the control board module near the bulkhead, and wherein the bulkhead has a front wall, a base surface extending generally perpendicularly from the front wall toward the plurality of fans, and a rear wall extending generally perpendicularly from the base surface opposite to the front wall, to define a plenum for air that is drawn by the plurality of fans.

18. The midplane-less storage enclosure of claim 12, wherein each storage disk drive is a serial Advanced Technology Attachment drive.

19. The midplane-less storage enclosure of claim 12, wherein the control board module has a second electrical connector; and
- wherein the bulkhead has connected thereto a second plurality of electrical connectors and a third electrical connector directly connected by one or more wires to each electrical connector of the second plurality of electrical connectors, the third electrical connector being electrically connected to the second electrical connector of the control board module so that each storage disk drive connected to one of the second plurality of electrical connectors is in electrical communication with, the control board module.

* * * * *

UNITED STATES PATENT AND TRADEMARK OFFICE
CERTIFICATE OF CORRECTION

| | | |
|---|---|---|
| PATENT NO. | : 7,145,776 B2 | Page 1 of 1 |
| APPLICATION NO. | : 10/745100 | |
| DATED | : December 5, 2006 | |
| INVENTOR(S) | : King, Jr. et al. | |

It is certified that error appears in the above-identified patent and that said Letters Patent is hereby corrected as shown below:

In Claim 11, column 8, line 52, replace "of claim 8" with -- of claim 1 --.

In Claim 12, column 9, line 5, before "first" insert -- the --.

In Claim 19, column 10, delete "," after "with".

Signed and Sealed this

Twenty-seventh Day of March, 2007

JON W. DUDAS
*Director of the United States Patent and Trademark Office*